United States Patent [19]
Sugioka et al.

[11] Patent Number: 5,258,573
[45] Date of Patent: Nov. 2, 1993

[54] SUPERCONDUCTOR MAGNETIC SHIELD

[75] Inventors: Takao Sugioka; Yoshiro Saji; Hiroaki Toda; Tetsuo Takagi; Masaru Inoue; Kohei Otani; Manabu Sato, all of Osaka, Japan

[73] Assignee: Koatsu Gas Kogyo Co., Ltd., Osaka, Japan

[21] Appl. No.: 884,442

[22] Filed: May 18, 1992

[30] Foreign Application Priority Data

May 17, 1991 [JP] Japan .................... 3-142380

[51] Int. Cl.$^5$ .......................... H05K 9/00; H04B 3/28
[52] U.S. Cl. ..................... 174/35 R; 505/1; 505/872
[58] Field of Search ............ 174/35 R, 35 MS, 125.1; 361/424; 505/1, 701, 704, 872, 884, 887

[56] References Cited

U.S. PATENT DOCUMENTS 4,977,296  12/1990  Hemming ............... 174/35 MS

FOREIGN PATENT DOCUMENTS 2105497  5/1987  Japan .................... 505/872

Primary Examiner—Leo P. Picard
Assistant Examiner—Bot Ledynh
Attorney, Agent, or Firm—Koda and Androlia

[57] ABSTRACT

A large-area superconductor magnetic shield comprising a plurality of small superconductor unit layers stuck onto the surface of a large-area substrate, wherein the external peripheral sections of the adjacent unit layers are overlapped mutually or the end sections of the adjacent unit layers are abutted mutually such that the adjacent unit layers do not make contact with one another. Compared with conventional magnetic shields, the magnetic shielding amount at the overlapping sections of the magnetic shield of the present invention is substantially greater.

15 Claims, 6 Drawing Sheets

EXTERNAL MAGNETIC FIELD INTENSITY H 1a  1b  1c 1a  1a  1b  1b  1c  1d

X—Y

SUPERCONDUCTOR MAGNETIC SHIELD

BACKGROUND OF THE INVENTION

1. Field of the Invention

The present invention relates to improvements of a magnetic shield for shielding intense magnetic fields, more particularly, improvements of a magnetic shield having a large area to prevent magnetic leakage in wide ranges.

2. Prior Art

To avoid adverse effects of magnetic fields generated from magnets or other substances, the art of magnetic shields which are made by using plate-shaped or sheet-shaped superconductors refrigerated below a critical temperature where superconductivity is generated is known as a conventional art for magnetically shielding a certain internal space. To achieve the object of shielding such magnetic fields, the second class superconductor which operates in the mixture region of the superconducting and normal conducting conditions is used more preferably than the first class superconductor, since the upper critical temperature of the second class superconductor is higher than that of the first class superconductor.

The maximum magnetic field shielding intensity of a superconductor, that is, the shielding intensity of a superconductor having a shape of a plate, sheet, film or membrane (in the general explanations described below simply referred to as "layer") for completely shielding external magnetic fields is significantly dependent on the class, size and shape of the superconductor. As pointed out in the patent specifications cited below by the inventors of the present invention, the maximum magnetic field shielding intensity of a superconductor increases abruptly as its thickness increases in a limited range. If the thickness increases over a certain value, the increasing rate of the maximum magnetic field shielding intensity becomes gentle. This indicates that an inflexion point is present on a curve which represents the relationship between the thickness of the superconductor and its maximum magnetic field shielding intensity. Considering this phenomenon, the inventors of the present invention have proposed a magnetic shield, the maximum magnetic field shielding intensity of which is significantly enhanced by using superconductor layers, the thickness of which is made smaller than that corresponding to the reflection point of the magnetic field shielding intensity, by laminating a superconductor layer with a normal conductor layer such as aluminum foil and by increasing the number of laminated layers (Japanese Laid-open Patent Appln. 61-183979, U.S. Pat. No. 4,803,452, U.S. Pat. No. 4,797,646, Can. PAT. 1261050, EP Appln. 86 101613. 7-2208).

To expand the range of a magnetic shielding space by enlarging the area of a magnetic shield, the size of a single superconductor layer is limited owing to the limitation in the production requirements of superconductors. In the case of producing larger superconductor layers exceeding the limitation, an art for enlarging such a magnetic shield by mutually overlapping the end sections of a plurality of oxide superconductor ceramic plates for example and by sticking the end sections together with conductive adhesive is known (Japanese Laid-open Patent Appln. 63-313897). The inventors of the present invention have also proposed a magnetic shield made by sticking a plurality of small superconductor pieces onto the external or internal surface of a cylinder with its one end closed (Japanese Laid-open Patent Appln. 1-302799).

These days, superconductor magnets are made larger to generate more intense magnetic fields. Because of this enlargement, the space ranges affected by the intense magnetic fields are also expanded. To shield unnecessary permeation of intense magnetic fields, magnetic shields which can securely shield intense magnetic fields over large areas have been requested. Such magnetic shields are applied to superconductor motors and superconductor generators, as well as superconductor magnets themselves used in linear motor cars and electromagnetic propellent ships.

The maximum magnetic field shielding intensity of a plate-shaped magnetic shield for completely shielding a magnetic field is apt to become lower at the external peripheral section than at the central section of the magnetic shield. In the case of a disc-shaped magnetic shield for example, the maximum magnetic field shielding intensity is lower at its peripheral section farther away from its central section in the radial direction. For this reason, although complete shielding is possible at the central section, a part of magnetism permeates the external peripheral section, causing magnetic leakage. Consequently, to completely shield a constant external magnetic field permeating a surface area, shielding is necessary at the central section of the surface area of the magnetic shielding plate by using a magnetic shield having the maximum magnetic shielding amount exceeding the external magnetic field intensity generated at the end of the surface area. As a result, the size of the magnetic shield must be considerably larger than the surface area.

A serious problem in the magnetic shielding process is the generation of a flux jump phenomenon wherein magnetic flux permeating the external peripheral section of the magnetic shield flows abruptly to the central section of the magnetic shield. If this occurs, the magnetic shield is heated locally and its superconducting condition is converted into a normal conducting condition, thereby causing magnetic field leakage over the entire magnetic shield. If this flux jump occurs once, the magnetic shield cannot act as a superconductor and completely loses its magnetic shielding function. Since the amount of generated heat is greater as the transfer distance of magnetic flux is larger, it is difficult to stably maintain the superconducting condition in an intense magnetic field.

In the magnetic shield of the above-mentioned prior art, which is made large by mutually laminating and sticking a plurality of superconductor ceramic plates, superconductive shielding current flows across every two ceramic plates. The structure of the magnetic shield is thus considered to be the same as that comprising a single superconductor, thereby being apt to cause the danger of losing the magnetic shielding effect due to the generation of the flux jump.

In the case of a tubular magnetic shield formed by pressing and sticking superconductor pieces (comprising superconductive low-melting-point alloy powder) onto the surface of a tube, the structure of this magnetic shield is the same as that of a tube formed to have a large surface area made by using a single superconductor, since the adjacent superconductor pieces are joined by the superconductor alloy. Accordingly, the maximum magnetic shielding amount of the magnetic shield is lower at the upper peripheral section of the opening area of the tube and lowest at the sealed end section of the bottom of the tube, causing the danger of losing the magnetic shielding effect due to the generation of the flux jump at such sections.

As a countermeasure for reducing the effect of the flux jump, a plurality of small through holes are provided in the surface area of a thin superconductor film such that the transfer range of the magnetic flux is limited to reduce heating and prevent a chain reaction of magnetic flux flow (Japanese Laid-open Patent Appln. 63-233577, U.S. Pat. No. 4,828,931, Can. Pat. 1296089, UK Pat. 2203909, German Pat. Appln. P38-09452. 5-34, FR 8803822). Even when a magnetic shield is enlarged, however, it still has a problem of reduction in the maximum magnetic field shielding intensity at its peripheral section.

SUMMARY OF THE INVENTION

It is therefore the first object of the present invention to provide a magnetic shield capable of compensating for the reduction of the maximum magnetic shielding amount at the peripheral section of the magnetic shield and also capable of effectively shielding the intense magnetic field at a large surface area of the magnetic shield, and to prevent superconductivity from being lost owing to the generation of the flux jump which is relevant to the enlargement of the magnetic shield, thereby ensuring stability during magnetic shielding.

The second object of the present invention is to provide a superconductor magnetic shield capable of achieving completely zero magnetic field intensity even in the presence of a locally intense magnetic field so that the magnetic shield can cope with the spatial change in the magnetic field intensity in an ununiformed magnetic field.

To accomplish these objects, the superconductor magnetic shield of the present invention is made by arranging and sticking a plurality of small superconductor layers (each of which is hereafter referred to as "unit layer") onto the surface of a substrate (support member) having a desired shape, and the peripheral section of each unit layer is overlapped with the peripheral section of another unit layer in the normal direction in order to uniformize the maximum magnetic field shielding intensity of the magnetic field over the entire substrate or to locally strengthen the shielding intensity as a general feature.

DETAILED DESCRIPTION OF THE INVENTION

Figure 1A:
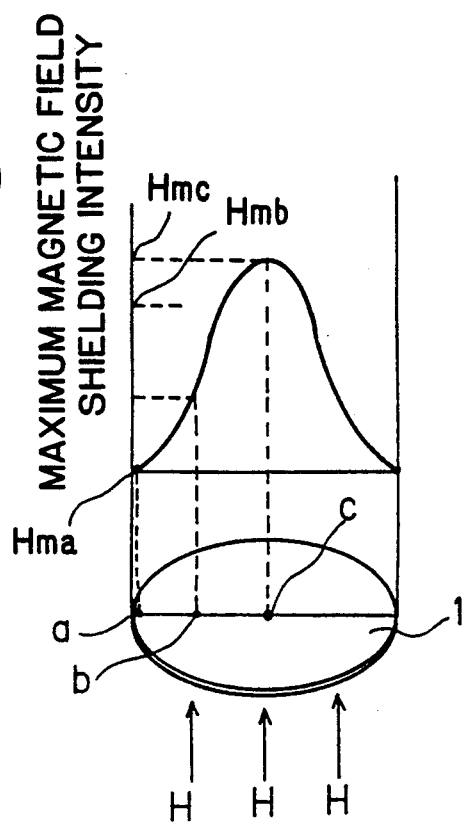
FIG. 1(A) shows a general radial direction distribution of the maximum magnetic field shielding intensity of a disc-shaped superconductor unit layer.

The superconductor magnetic shield of the genus invention of the present invention comprises a substrate and a plurality of independent superconductor unit layers arranged adjacent to one another and stuck onto the surface of the substrate, wherein the peripheral section of each unit layer is overlapped with the peripheral section or the central section of another adjacent unit layer in a non-direct contact manner in the normal direction of the substrate so that the magnetic shielding intensity at these overlapping sections can be increased substantially.

This genus invention can be generally classified into a first invention and a second invention.

In the case of the superconductor magnetic shield of the first invention, the surface areal plane including the superconductor unit layers of the above-mentioned structure is a single layer in the normal direction and the above-mentioned peripheral sections are overlapped mutually within the single layer. This first invention corresponds to claim 2.

In the case of the superconductor magnetic shield of the second invention, the surface areal planes including the superconductor unit layers of the above-mentioned structure are laminated to form a plurality of layers in a non-direct contact manner in the above-mentioned normal direction, the peripheral sections of the unit layers are in abutting contact with or proximate to the peripheral sections of the adjacent unit layers within the single layer, and the above-mentioned peripheral sections of the unit layers are overlapped mutually between every two layers in the normal direction. This second invention corresponds to claim 4.

The first invention further includes a superconductor magnetic shield wherein a plurality of layers, each comprising a plurality of superconductor unit layers, are laminated (claim 3), and in the same way, the second invention includes a superconductor magnetic shield wherein three or more layers are laminated (claim 6) and used to cover the surface of the substrate.

In addition, the present invention also includes a superconductor magnetic shield wherein the number of the layers comprising superconductor unit layers is increased at the magnetic flux concentration sections of the magnet shield (claim 7).

First, the technical matters common to the first and second inventions are described below.

The substrate is formed in accordance with the desired shape of the superconductor magnetic shield and is determined considering the shape of the superconductor magnet to be covered and the space range to be shielded. The substrate is mainly made of non-magnetic normal conductor material, such as copper, aluminum, stainless steel or low-temperature synthetic resin and is formed into a shape of a flat plate, curved plate or container.

The superconductor unit layer includes films or plates made of superconductor material. Although it can be a single thin superconductor plate, it preferably comprises laminations of thin superconductor plates and thin non-magnetic metal plates.

As superconductor material, Nb-Ti alloy, mixed crystal of NbN and TiN, $Nb_3Al$, $Nb_3Ge$, $Nb_3$ (Al, Ge), $Nb_3Sn$, Y-Ba-Cu-O-based oxide, Bi-Sr-Pb-Ca-Cu-O-based oxide or Tl-Sr-Ca-Cu-O-based oxide are used.

The superconductor unit layer can have a simple shape of a square, hexagon or circle. The appropriate size of the unit layer is 5 to 100 cm in diameter in the case of a circle.

The unit layers are stuck together with low-temperature organic adhesive or normal conductor low-melting-point alloy onto the surface of the above-mentioned substrate. When sticking unit layers to provide only one layer, the peripheral sections of the unit layers are overlapped mutually to prevent formation of any gap which is not covered with unit layers as viewed in the normal direction to the surface of the substrate and to completely cover the substrate. In this case, it is important that the overlap is performed so that the peripheral section of each unit layer does not make contact with those of other adjacent unit layers. To accomplish this, the adhesion layer formed by the above-mentioned adhesive should be insulated, or organic insulation films should be intervened at the overlapping sections or the front and rear surfaces of the superconductor unit layers should be a lamination covered with normal conductor metal, such as copper film or aluminum film.

To form two or more layers comprising the superconductor unit layers and to stick the layers onto the above-mentioned substrate, the unit layers are stuck sequentially onto the lower superconductor unit layer with the above-mentioned adhesive or normal conductor low-melting-point alloy. At the time of this process, although the thin superconductor films of the same layer can be abutted and arranged such that a gap generates between the films, the superconductor unit layers of the second layer must be arranged in the normal direction such that they cover the gaps generated in the first layer.

In addition, an electric insulation layer or a normal conductor layer should be intervened in the same manner as described above such that the superconductor unit layers of the first and second layers do not make contact with each other.

Figure 1B:
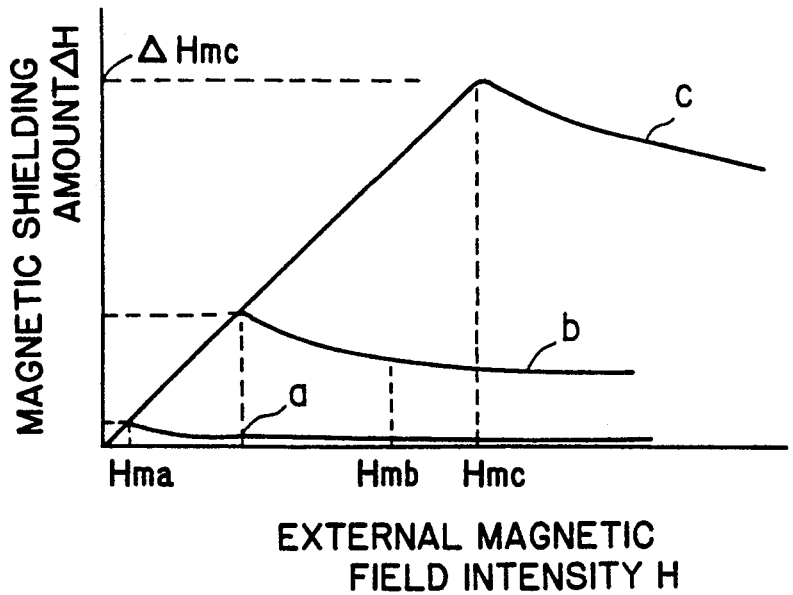
FIG. 1(B) shows the relationship between external magnetic field intensity and the magnetic shielding amount of the superconductor unit layer.

Generally, a superconductor sheet, for example, a disc-shaped superconductor does not have uniform magnetic shielding capability over its entire surface. The maximum magnetic field shielding intensity Hm of the superconductor at the time of complete shielding of an external magnetic field is highest at the center of the disc. The intensity lowers at the external peripheral section and becomes zero at the end section of the disc. The maximum magnetic field shielding intensity of the disc-shaped superconductor is shown as a skirt-shaped curve as shown in FIG. 1 (A) when a radius is taken as a variable. FIG. 1 (B) shows the relationship between an external magnetic field intensity and a magnetic shielding amount $_\Delta H$ (a difference between the magnetic field intensity obtained when a magnetic shield is present at a measurement position and that obtained when the magnetic shield is absent) measured in the radial direction from the central section c to the end section a of the disc-shaped superconductor. According to the figure, the magnetic shielding amount at the central section c is equal to the external magnetic field intensity in response to the initial increase of the external magnetic field intensity and the magnetic field does not permeate the superconductor. However, if the external magnetic field intensity becomes greater than the maximum magnetic shielding amount $_\Delta Hm$, the magnetic shielding amount $_\Delta H$ becomes smaller instead. In other words, if the external magnetic field intensity is greater than the maximum magnetic shielding amount $_\Delta Hm$, the magnetic flux of the magnetic field becomes to penetrate the superconductor. When the maximum magnetic shielding amount $_\Delta Hm$ is assumed to be the maximum magnetic field shielding intensity Hm, the value of Hm becomes smaller at positions farther away from the central section of the disc and becomes zero at the end section, resulting in no magnetic shielding capability.

The maximum magnetic field shielding intensity Hm at the central surface section of a sheet-shaped superconductor differs depending on the type, structure and thickness of the superconductor. When a disc-shaped superconductor is taken as an example, the intensity Hm generally increases abruptly as the disc diameter increases up to about 50 cm. The value still increases gradually as the diameter increases further. For this reason, the superconductor unit layer is limited to a small size of 5 to 100 cm in diameter.

Figure 2:
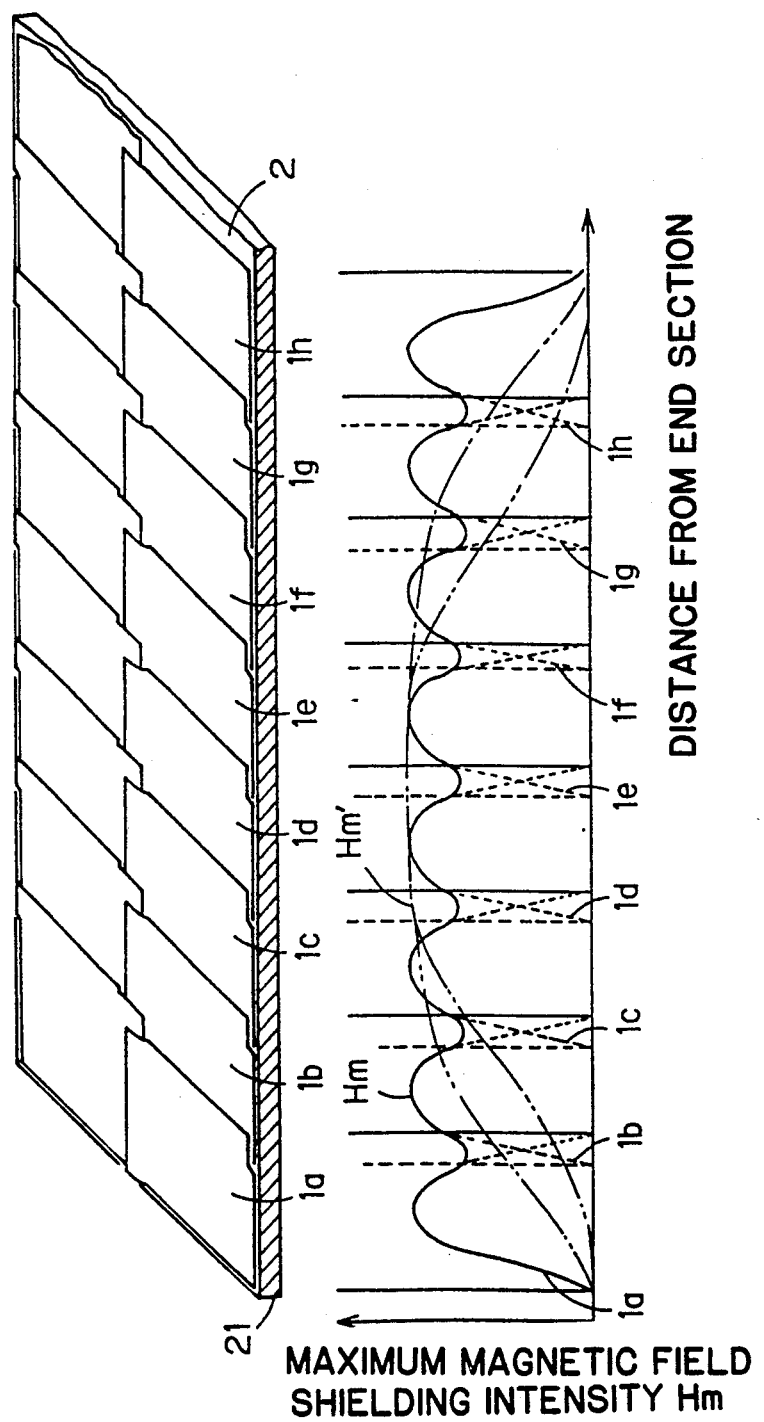
FIG. 2 is a sectional view of a magnetic shield formed by overlapping the peripheral sections of rectangular thin superconductor unit layers of an example of the present invention and also shows a distribution of the maximum magnetic field shielding intensity at the illustrated cross-section.

The magnetic shield of the first invention is made by arranging and sticking such small superconductor unit layers onto the surface of the substrate while vertically overlapping the external peripheral sections of the superconductor unit layers and while using care so that the adjacent superconductors do not make contact with one another. With this structure, the maximum magnetic field shielding intensity at the overlapping sections is a sum of the magnetic field shielding intensity of the upper superconductor unit layer and that of the lower superconductor unit layer as shown in FIG. 2. By relatively expanding the width of the overlapping sections, the maximum magnetic field shielding intensity values at all surface area positions of the magnetic shield are uniformized to a value greater than a certain value. For this reason, when a large-area magnetic shield is formed by a single superconductor or by laminating a plurality of small superconductor pieces such that they make contact with one another, the maximum magnetic field shielding intensity of the magnetic shield reduces in the wide range of the peripheral sections of the superconductor as shown by the Hm' curve in FIG. 2. As a result, the external magnetic field which must be shielded cannot be shielded completely and magnetic field leakage occurs. To solve this problem, a magnetic shield with a surface area far wider than the surface area of the external magnetic field to be shielded is required. However, the magnetic shield of the present invention has superior magnetic shielding capability even at its peripheral sections except the very narrow ranges close to its end sections as high as the capability obtained at its central section, as indicated by the Hm curve shown in FIG. 2. The size of the surface area of the magnetic shield can thus be made approximately equal to that of the external magnetic field to be shielded.

In the first invention, when the layer formed on the substrate by overlapping the peripheral sections of the superconductor unit layers is further laminated with another layer to form two layers, while the upper and lower superconductor unit layers are maintained in a non-contact manner and while the overlapping section of each lower unit layer is positioned at the central section of the corresponding upper unit layer, the distribution of the maximum magnetic field shielding intensity of the magnetic shield is further uniformized and flattened. To further flatten the distribution, three or more layers should be used.

In the second invention, superconductor unit layers are laminated in two or more layers on the substrate. Adjacent layers are proximate to or abutted against each other. The peripheral section of each superconductor unit layer of the first layer is overlapped with one of the superconductor unit layers of the second layer. As a result, the maximum magnetic field shielding intensity of the superconductor unit layer located just above the peripheral section of another superconductor unit layer is added to the low maximum magnetic field shielding intensity of the peripheral section, thereby obtaining the maximum magnetic field shielding intensity that is larger than a certain level over the entire surface of the magnetic shield.

In the magnetic shield of the second invention, there is no magnetic shielding capability at the abutted sections between the adjacent unit layers or the void portions proximate to the adjacent unit layers when only the first layer comprising superconductor unit layers is used. By laminating the second layer comprising the superconductor unit layers over the first layer, the magnetic field shielding capability at the above-mentioned abutted sections or the proximate void portions of the first and second layers can be compensated for.

Since the magnetic shield of the present invention is formed by sticking a plurality of superconductor unit layers onto the surface of the substrate while maintaining the non-contact manner in the normal direction, the shielding current for preventing the intrusion of external magnetic fields flows only inside the corresponding unit layer, but the unit layer is isolated from other adjacent unit layers. With this structure, even if flux jump (the abrupt transfer of magnetic flux permeated at and transferred from the peripheral section to the central section of the unit layer) occurs, the mutual action between the magnetic flux and the shielding current is limited within the corresponding unit layer and the chain reaction of the flux jump is also limited within the corresponding unit layer, thereby causing no adverse effect to other adjacent superconductor unit layers. Since the size of the unit layer can be made small, the transfer distance of the magnetic flux can also be made small. Even when magnetic flux flow occurs frequently, the heating value of the unit layer is limited. Even if the temperature of the unit layer increases, the unit layer can be refrigerated by immersed refrigerant such as liquid helium. This minimizes the possibility of raising the temperature of the unit layer over its critical temperature, the possibility of converting the unit layer into a normal conductor and the possibility of losing the magnetic shielding function of the unit layer. For this reason, the present invention can form a large-area magnetic shield which rarely causes unstable conditions due to flux jump.

In particular, when the superconductor unit layer is laminated with a normal conductor metal layer, the normal conductor metal layer shuts off the flow of the above-mentioned shielding current of the unit layer and isolates each superconductor layer. When aluminum, particularly copper or silver is used as metal, the superior heat conductivity of such metal is significantly effective in externally dispersing the heat generated by the flow of magnetic flux and thus also effective in refrigerating the layers, thereby effectively preventing instability due to the flow of the magnetic flux.

When a single layer of the superconductor unit layer is used, it usually comprises rolled Nb-Ti alloy foil with a thickness of 100 $\mu$m or less. As the thickness is larger, the maximum magnetic field shielding intensity of the superconductor layer becomes greater. However, if the thickness increases to 20 $\mu$m or more, the increasing rate of the maximum magnetic field shielding intensity reduces. This increasing of the thickness is thus not advantageous. Rather than using the thicker foil, a lamination comprising Nb-Ti alloy foil of 20 $\mu$m or less in thickness and normal conductor foil such as copper or aluminum foil should be used. Increasing the number of laminations is advantageous, since the maximum magnetic shielding amount can be made larger. When forming the lamination comprising the Nb-Ti alloy foil and the normal conductor foil, the sputtering method for the Nb-Ti alloy and copper or aluminum can be used. The sputtering method is also used when the unit layer is formed from the mixed crystal of NbN and TiN. More specifically, the above-mentioned sputtering method is conducted on one or two kinds of metal layers selected from the group consisting of copper, aluminum, nickel, stainless steel, titanium, niobium and niobium-titanium alloy to form the lamination. When forming the superconductor unit layer from $Nb_3Al$, $Nb_3Ge$, $Nb_3$ (Al, Ge) and $Nb_3Sn$, the thin films formed by the sputtering method or the like can be used. In addition, the films which are heat-treated after rolling and lamination can be used. As the normal conductor layer, one or two kinds of metal layers selected from the group consisting of copper, aluminum, nickel, stainless steel and titanium can be used.

For the magnetic shield of the present invention, a plate-shaped superconductor can be used as one of the superconductor unit layers. As the plate-shaped superconductor, a plate made of the Y-Ba-Cu-O-based oxide, Bi-Sr-Pb-Ca-Cu-O-based oxide or Tl-Sr-Ca-Cu-O-based oxide can be used. In addition, a sintered plate of 0.5 to 10 mm in thickness can also be used as the plate-shaped superconductor.

When a plurality of small through holes are provided in the superconductor unit layer, the transfer of the magnetic flux at the peripheral section of the unit layer is limited in the range of the adjacent small holes and no flux jump occurs at the central section of the unit layer. The range of the flux jump can thus be restricted within the range approximate to the space between the holes, thereby eliminating the danger of making the superconductor unstable. If the diameter of the holes is made larger, however, the magnetic shielding amount is lowered. The opening area of the holes should therefore be 3 $cm^2$ or less and preferably the diameter of the hole should be about 50 $\mu$m.

Since the present invention provides a large-area magnetic shield by sticking a plurality of small superconductor unit layers onto the substrate, the superconductor unit layer can have a small size of about 5 to 100 cm. Such superconductor unit layers can thus be produced very easily. Furthermore, magnetic shields of larger sizes or with various curvatures can also be produced easily by sticking a plurality of unit layers onto the substrates made by welding and assembling.

Moreover, since the magnetic characteristics of the unit layer can be measured accurately and easily by ordinary test methods, the characteristics of an assembled magnetic shield can be estimated fairly accurately by determining the sticking method according to the magnetic data of the unit layer.

EXAMPLES

Figure 3:
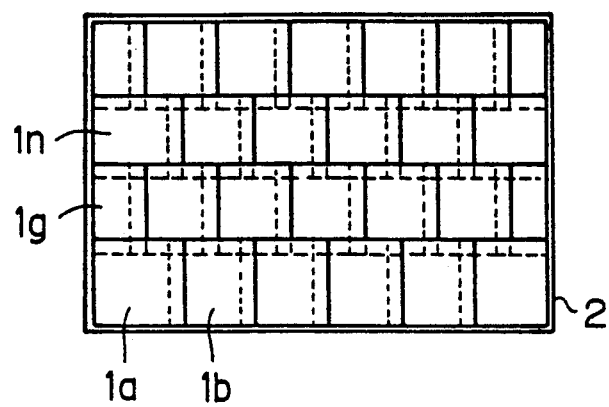
FIG. 3 is a plan view of a magnetic shield made by sticking square superconductor unit layers.

An example of the first invention is first explained below referring to the drawings. FIG. 3 shows an example of a magnetic shield wherein square superconductor sheets 1a, 1b, ... are laminated as unit layers on a rectangular flat substrate 2 so that the peripheral section of one sheet is overlapped with and stuck onto that of another sheet. As the superconductor sheets 1a, 1b, ..., thin flexible alloy plates are appropriate, and particularly a single layer of Nb-Ti alloy foil of 100 $\mu$m or less in thickness or an alternate lamination of Nb-Ti alloy foil and aluminum foil of 20 $\mu$m or less in thickness can be used. Low-temperature organic adhesive (not shown) is used for sticking. An adhesive layer is intervened between the overlapping sections of the superconductor sheets 1a and 1b such that the overlapping sections thereof do not make direct contact with each other. When using the lamination comprising the Nb-Ti alloy foil and aluminum foil, the front and rear surfaces of the lamination are covered with aluminum foil to prevent direct contact between the overlapping sections of the adjacent pieces of superconductor Nb-Ti alloy foil. This method is advantageous since the adhesive for preventing the direct contact is unnecessary.

Figure 4A:
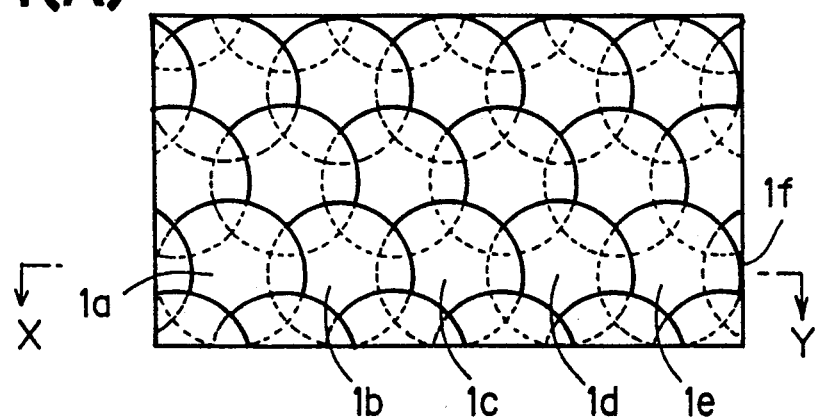
FIG. 4(A) and FIG. 4(B) are respectively a plan view and a vertical sectional view of a magnetic shield made by sticking disc-shaped superconductor unit layers.
Figure 4B:
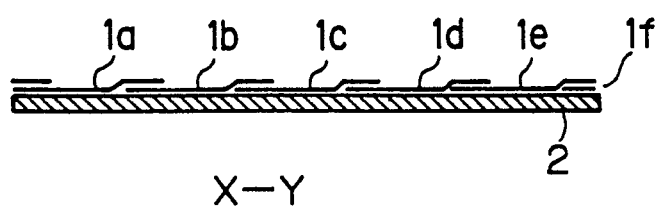

FIG. 4 shows an example of laminating and sticking disc-shaped superconductor sheets as superconductor unit layers. For the superconductor sheets shown in FIGS. 3 and 4, non-flexible thin oxide superconductor plates can also be used. Even in this case, an organic adhesive layer is intervened between the overlapping sections of the plates so that the superconductors do not make direct contact with each other at the overlapping sections, and the superconductor sheets are stuck onto the substrate 2.

The substrate 2 of the magnetic shield shown in FIGS. 3 and 4 has a rectangular shape. By combining a plurality of such rectangular substrates, a container-shaped magnetic shield can be formed. Besides, since flexible superconductor sheets can be easily stuck onto a curved substrate, magnetic shields having desired shapes and large areas can be formed.

By sticking and covering one or two more layers comprising superconductor unit layers of the same size over the layer comprising superconductor unit layers stuck as shown in FIGS. 3 and 4, the maximum magnetic field shielding intensity of the magnetic shield thus obtained can be enhanced and flattened.

Examples of the second invention are then described below.

Figure 5A:
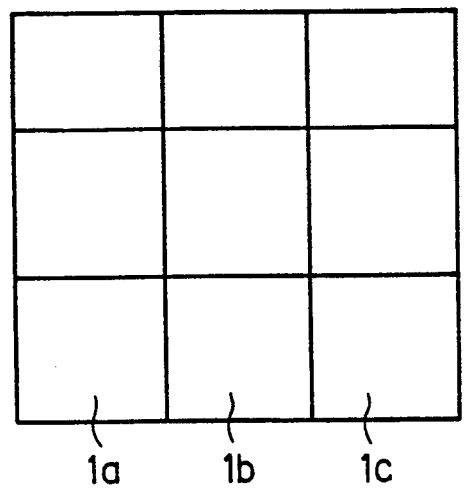
FIG. 5(A) is a plan view of a magnetic shield provided with abutted and stuck square sheet-shaped superconductor unit layers.
Figure 5B:
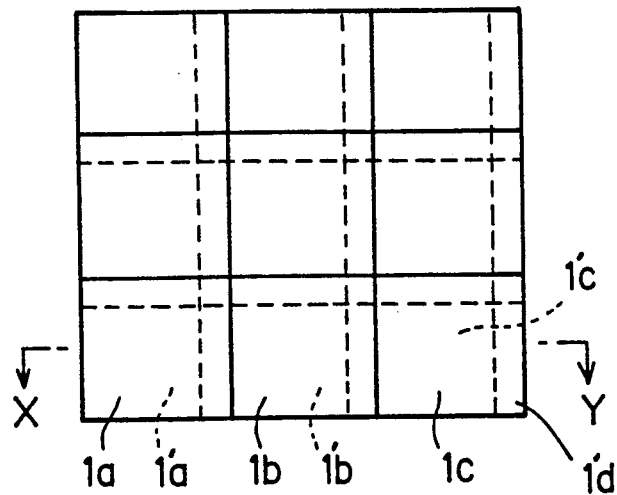
FIG. 5(B) and FIG. 5(C) are respectively a plan view and a vertical sectional view of a magnetic shield with two vertically arranged layers comprising the sheet-shaped superconductor unit layers of the example of the present invention.
Figure 5C:
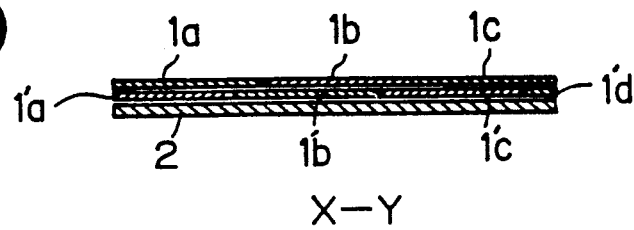

FIG. 5(A) shows an example wherein square superconductor sheets used as unit layers are stuck with the end sections thereof abutted. This example is applied particularly to non-flexible rigid superconductor plates, for example the above-mentioned oxide superconductor plates. In this case, a small gap is provided at each end of the abutted section thereof to prevent the adjacent superconductors from making contact with one another and to allow an adhesive layer to intervene in the gap. In the case of this method of sticking the unit layers by abutting them, the maximum magnetic field shielding intensity at the abutting sections is approximately zero and magnetic leakage occurs. To solve this problem, the abutted and stuck superconductor plates must be laminated in two layers as shown in FIG. 5(B) and 5(C), and the abutting sections of the upper layer must be shifted in the surface direction so that the abutting sections of the upper layer do not coincide with those of the lower layer. To completely prevent magnetic shielding leakage and to uniformize the maximum magnetic field shielding intensity, the lamination structure should have three or more layers.

Figure 6A:
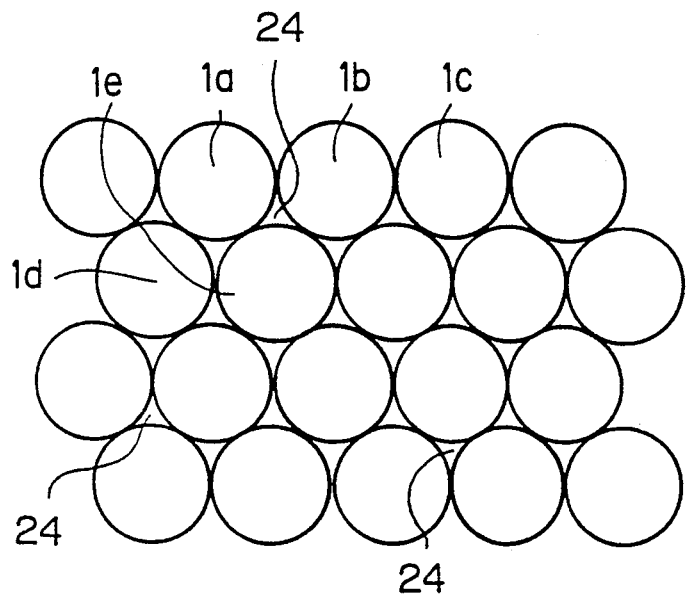
FIG. 6(A) is an arrangement view of abutted and stuck disc-shaped superconductor unit layers and FIG. 6(B) is an arrangement view of three vertically laminated layers of the disc-shaped superconductor unit layers of the example of the present invention.

FIG. 6(A) shows the arrangement of the first layer wherein discs 1a, 1b, ... are abutted and stuck as unit layers. In this case, even when the discs are placed in the highest density, a substantial void portion 24 is formed among every three adjacent discs.

Figure 6B:
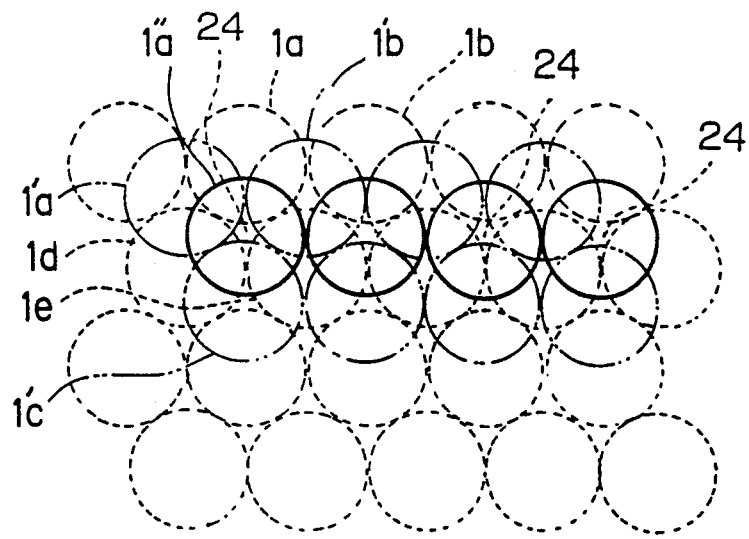

As shown in FIG. 6(B), the superconductor discs 1'a, 1'b, ... of the second layer are stuck and arranged to cover the void portion 24 enclosed by every three adjacent discs of the above-mentioned first layer. Even in this two-layer structure, magnetic leakage still occurs at each position where the void portion 24 of the lower layer coincides with the void portion 24 of the upper layer. To prevent this leakage, the superconductor discs 1"a, 1"b, ... of the third layer are stuck to cover the void portions 24 located at such coincidence positions. By providing a lamination structure of three or more layers, the maximum magnetic field shielding intensity of this example can be uniformized and flattened. The method of sticking such discs is suited particularly for fragile superconductor ceramics, since disc-shaped sintered products can be made easily.

Figure 7:
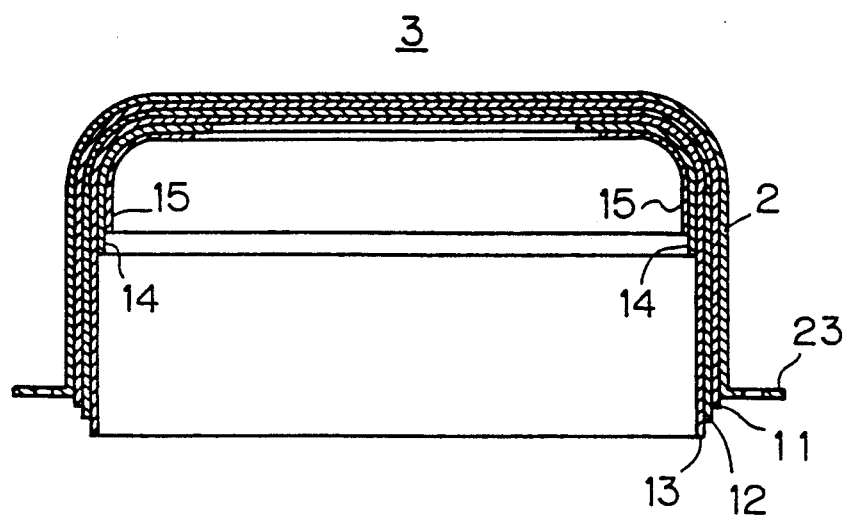
FIG. 7 is a vertical sectional view of a container-shaped magnetic shield, the internal surface of which is covered with a plurality of layers comprising the sheet-shaped superconductor unit layers of the present invention.

FIG. 7 shows a vertical sectional view of an upper part of a container-shaped magnetic shield wherein a plurality of layers comprising plate-shaped superconductor ceramic layers used as unit layers are stuck inside. The three layers 11, 12 and 13 comprising the ceramic plates are stuck onto the inside surface of the container-shaped copper substrate 2. Furthermore, two layers 14 and 15 are additionally stuck onto the corner sections of the substrate to shield the high magnetic field intensity generated by the concentration of the magnetic lines of force at the corner sections.

Next, the production method and test results of the magnetic shields of the present invention are described below.

Superconductor unit layers were produced as follows. A lamination plate having a total of 25 layers was produced wherein each layer was made by laminating Nb-Ti alloy and copper which were alternately evaporated in a thickness of 0.4 $\mu$m on a copper plate measuring a thickness of 18 $\mu$m and a diameter of 30 mm by using a sputtering apparatus. The plate was then cut into square pieces having a side length of 50 mm to obtain superconductor sheets.

The substrate was made of 5 mm thick copper plate. It was formed into a pan shape having a diameter of 400 mm and equipped with a flat bottom and curved external peripheral sections. Over the entire internal surface of the substrate, the 10 mm wide overlapping sections of the above-mentioned superconductor sheets were provided by the overlapping method described in the explanation of the example of the first invention shown in FIG. 3 and stuck with low-temperature epoxy adhesive to form a magnetic shield. Two superconductor sheet layers were provided at the central flat section of the magnetic shield and five layers were used at the curved peripheral sections and end sections thereof.

Figure 8:
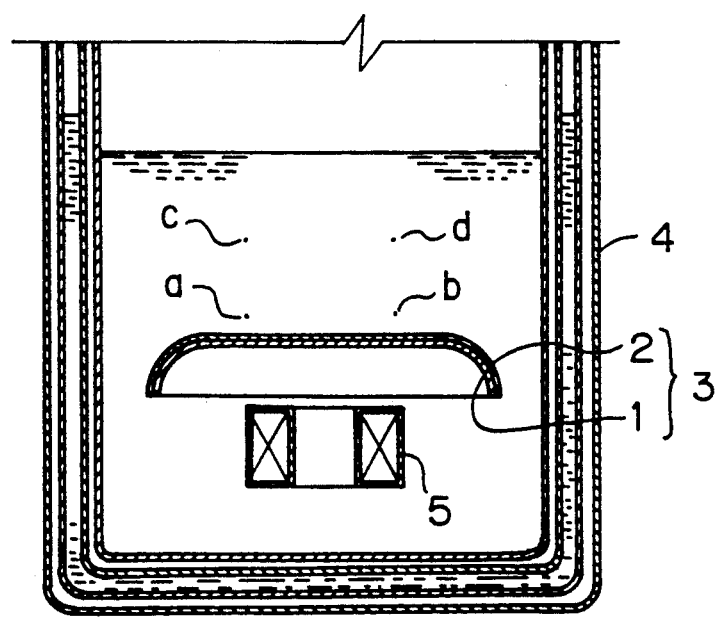
FIG. 8 is an outline sectional view of an apparatus for testing the magnetic characteristics of the magnetic shield shown in FIG. 7.

As shown in FIG. 8, a superconductor coil 5 was provided at a lower section of an adiabatic vacuum container 4 having an internal diameter of 500 mm. Over the coil, a pan-shaped magnetic shield 3 was disposed with its internal surface side facing downwards. The interior of the adiabatic container was filled with liquid helium to refrigerate the superconductor coil 5 and the magnetic shield 3. The magnetic field inside the container was measured at four positions a, b, c and d over the magnetic shield 3 by using a magnetic field measurement sensor.

The exciting current of the superconductor coil magnet 5 was first obtained so that the measured magnetic field intensity was 1000 G at the measurement points e and f without installing the magnetic shield 3. The magnetic shield 3 was then installed at the specified position, the same existing current was flowed in the superconductor coil 5, and the magnetic field intensity was measured. The measured magnetic field intensity values were 5 G or less at all measurement positions a, b, c and d.

A magnetic shield made of an oxide represented by a chemical formula of $Y_{1.0}Ba_{2.0}Cu_{3.0}O_{7-x}$ used as an oxide superconductor was then tested. A mixture of $Y_2O_3$, $BaCO_3$ and $CuO$ was heated, melted and abruptly refrigerated, then pulverized. The power obtained in this way was press-molded into a shape of a disc and fired to produce a plate-shaped superconductor. To form thin films from the oxide, the oxide powder was applied to or printed on a metal plate made of copper for example, then fired.

The fired superconductor discs measuring 50 mm in diameter and 5 mm in thickness were arranged in three layers as shown in FIG. 6 and stuck onto the internal surface of the pan-shaped substrate made of copper and measuring a thickness of 5 mm and an outer diameter of 400 mm as shown in FIG. 8. The magnetic shielding amount of this example was then measured using the above-mentioned testing apparatus. The maximum magnetic shielding amount of the example was 20000 G in the 70% surface area including the central section of the pan-shaped substrate.

Consequently, the magnetic shield of the present invention can provide the following advantages.

Since a plurality of small superconductor unit layers can be stuck onto a substrate while being overlapped at their peripheral sections without allowing the superconductors to make contact with one another and a large-area magnetic shield can be formed, the maximum magnetic field shielding intensity of the magnetic shield can be uniformized in the surface area of the magnetic shield without causing the reduction of the intensity at the external peripheral sections thereof except the ranges very close to the end sections. Besides, the reduction of the maximum magnetic field shielding intensity which occurs at the external peripheral sections of a large-area magnetic shield formed by a continuous superconductor can be compensated for and prevented by the magnetic shield of the present invention. The size of the magnetic shield can thus be made almost as large as the range of an external magnetic field to be shielded. The magnetic shield of the present invention can therefore be made relatively smaller than the magnetic shield formed by such a continuous superconductor.

In addition, since two or more layers comprising stuck superconductor unit layers are used, the maximum magnetic field shielding intensity of the magnetic shield of the present invention can be enhanced, uniformized and flattened in the external peripheral direction.

Furthermore, when a plurality of superconductor unit layers are abutted and stuck at their end sections and laminated to form two or more, particularly three or more layers, the magnetic leakage at the abutting sections can be prevented and the maximum magnetic field shielding intensity of the magnetic shield can be enhanced significantly.

In particular, since the number of the laminations can be increased at the end sections of the magnetic shield, particularly in the limited ranges exposed to high magnetic field intensity, the magnetic shield of the present invention can cope with the change in the intensity of local external magnetic fields by compensation, thereby easily achieving complete magnetic shielding.

Moreover, since the superconductors of adjacent superconductor unit layers are isolated so that they do not make contact with one another, the possibility of causing flux jump is eliminated over the entire magnetic shield. Even if flux jump occurs, it is limited in the range of a small superconductor and heat generation is minimal, thereby extremely reducing the danger of causing the superconductor to be converted into a normal conductor. In particular, when the superconductor unit layers have a lamination structure comprising superconductor and normal conductor films or when a plurality of small through holes are provided in the superconductor unit layers, the factors for causing instability due to flux jump can be eliminated substantially and the reliability of the magnetic shield of the present invention can be enhanced significantly.

When the magnetic characteristics, size and shape as well as the sticking method and the number of laminations of the superconductor unit layers have been known, the magnetic shielding capability of a large-area magnetic shield made by sticking the unit layers can be estimated fairly accurately. In the case of a conventional magnetic shield, preliminary experimental testing of the shielding capability of a practically large magnetic shield is virtually impossible partly because larger testing apparatuses must be used. In the case of the magnetic shield of the present invention, it is possible to estimate the magnetic characteristics of the magnetic shield according to partial test results, since the unstable phenomena due to the above-mentioned flux jump do not occur.

We claim:

1. A superconductor magnetic shield comprising a substrate and a plurality of independent superconductor unit layers arranged adjacent to one another and stuck onto a surface of said substrate, wherein a peripheral section of each unit layer is overlapped with the peripheral section or a central section of another adjacent unit layer in a non-direct contact manner in a normal direction of said substrate so that magnetic shielding amount at the overlapping sections can be increased substantially.

2. A superconductor magnetic shield according to claim 1, wherein a surface areal plane including said superconductor unit layers is a single layer in the normal direction and the peripheral sections are overlapped mutually within said single layer.

3. A superconductor magnetic shield according to claim 1, wherein surface areal planes including said superconductor unit layers are laminated to form a plurality of layers in a non-direct contact manner in the normal direction and the peripheral sections of said unit layers are overlapped mutually within each layer.

4. A superconductor magnetic shield according to claim 1, wherein surface areal planes including said superconductor unit layers are laminated to form a plurality of layers in a non-direct contact manner in the normal direction, the peripheral sections of said unit layers are in abutting contact with or proximate to the peripheral sections of said adjacent unit layers, and the peripheral sections of said unit layers are overlapped mutually between every two layers.

5. A superconductor magnetic shield according to claim 4, wherein non-contacting void portions are formed among the adjacent peripheral sections of said superconductor unit layers within a single layer and void portions are overlapped with said adjacent unit layers within a single layer or a plurality of layers in the normal direction.

6. A superconductor magnetic shield according to claim 4 or 5, wherein the number of the plurality of said layers is three.

7. A superconductor magnetic shield according to claim 1, 2, 3 or 4, wherein the number of said superconductor unit layers laminated on the surface of said substrate is increased at magnetic flux concentration sections of said magnetic shield.

8. A superconductor magnetic shield according to claim 1, 2, 3 or 4, wherein said superconductor unit layer is a lamination of a superconductor layer and a normal conductor layer.

9. A superconductor magnetic shield according to claim 1, 2, 3 or 4, wherein said superconductor unit layer is a lamination obtained by forming mixed crystal of NbN and TiN on one or two kinds of metal layers selected from the group consisting of copper, aluminum, nickel, stainless steel, titanium, niobium and niobium- titanium alloy by a sputtering method.

10. A superconductor magnetic shield according to claim 1, 2, 3 or 4, wherein non-contacting overlap is performed with a normal conductor layer or an electric insulation layer intervened between said superconductor unit layers.

11. A superconductor magnetic shield according to claim 8, wherein said normal conductor layer is one or two kinds of metal layers selected from the group consisting of copper, aluminum, nickel, stainless steel and titanium.

12. A superconductor magnetic shield according to claim 9, wherein said normal conductor layer is one or two kinds of metal layers selected from the group consisting of cooper, aluminum, nickel, stainless steel and titanium.

13. A superconductor magnetic shield according to claim 10, wherein said electric insulation layer is an organic adhesive layer.

14. A superconductor magnetic shield according to claim 1, 2, 3 or 4, wherein a plurality of small through holes are provided in said superconductor unit layer to pass through said superconductor unit layer at least from a front surface to a back surface thereof.

15. A superconductor magnetic shield according to claim 1, 2, 3 or 4, wherein said superconductor unit layer is made of Nb-Ti alloy, mixed crystal of NbN and TiN, $Nb_3Al$, $Nb_3Ge$, $Nb_3(Al, Ge)$, $Nb_3Sn$, Y-Ba-Cu-O-based oxide, Bi-Sr-Pb-Ca-Cu-O-based oxide or Tl-Sr-Ca-Cu-O-based oxide.

* * * * *